(12) United States Patent
Bauer et al.

(10) Patent No.: US 7,800,241 B2
(45) Date of Patent: Sep. 21, 2010

(54) SEMICONDUCTOR DEVICE WITH SEMICONDUCTOR DEVICE COMPONENTS EMBEDDED IN A PLASTICS COMPOSITION

(75) Inventors: Michael Bauer, Nittendorf (DE); Thomas Bemmerl, Schwandorf (DE); Edward Fuergut, Dasing (DE)

(73) Assignee: Infineon Technologies AG, Neubiberg (DE)

( * ) Notice: Subject to any disclaimer, the term of this patent is extended or adjusted under 35 U.S.C. 154(b) by 751 days.

(21) Appl. No.: 11/455,949

(22) Filed: Jun. 20, 2006

(65) Prior Publication Data

US 2007/0001319 A1    Jan. 4, 2007

(30) Foreign Application Priority Data

Jun. 20, 2005    (DE) .................. 10 2005 028 704

(51) Int. Cl.
*H01L 23/48* (2006.01)
*H01L 23/52* (2006.01)
*H01L 29/40* (2006.01)

(52) U.S. Cl. ............... 257/783; 257/795; 257/E23.077

(58) Field of Classification Search ............... 257/783, 257/795, E23.077
See application file for complete search history.

(56) References Cited

U.S. PATENT DOCUMENTS

| 5,205,036 A | 4/1993 | Yamazaki |
| 5,554,569 A | 9/1996 | Ganesan et al. |
| 5,708,129 A * | 1/1998 | Nguyen et al. ............. 528/362 |
| 5,759,874 A | 6/1998 | Okawa |
| 7,013,965 B2 * | 3/2006 | Zhong et al. ............... 165/185 |
| 2004/0206448 A1 | 10/2004 | Dubrow |

FOREIGN PATENT DOCUMENTS

| DE | 10124047 A1 | 11/2002 |
| DE | 10221503 | 11/2003 |
| WO | WO 03/009689 | 11/2003 |
| WO | WO2005/024942 A1 | 3/2005 |

* cited by examiner

*Primary Examiner*—David A Zarneke
*Assistant Examiner*—Jenny L Wagner
(74) *Attorney, Agent, or Firm*—Dicke, Billig & Czaja, PLLC

(57) ABSTRACT

A semiconductor device with semiconductor device components embedded in a plastics composition is disclosed. In one embodiment, organosilicon and organometallic compounds are used for producing an adhesion promoter layer. The adhesion promoter layer on the surfaces of the semiconductor device components of a semiconductor device has a microporous morphology and has an average thickness D of between 5 nm $\leq D \leq 300$ nm. In this case, the adhesion promoter layer has nanoscale ceramic grains applied wet-chemically.

16 Claims, 6 Drawing Sheets

SEMICONDUCTOR DEVICE WITH SEMICONDUCTOR DEVICE COMPONENTS EMBEDDED IN A PLASTICS COMPOSITION

CROSS-REFERENCE TO RELATED APPLICATIONS

This Utility Patent Application claims priority to German Patent Application No. DE 10 2005 028 704.2 filed on Jun. 20, 2005, which is incorporated herein by reference.

FIELD OF THE INVENTION

The invention relates to a semiconductor device with semiconductor device components embedded in a plastics composition, the surfaces of the semiconductor device components partially having an adhesion promoter layer. Furthermore, the invention relates to methods for producing semiconductor devices, system carriers and an adhesion promoter layer of this type.

BACKGROUND

In the case of semiconductor devices, a lack of adhesion between a system carrier and the plastics composition has the effect that moisture accumulates in the boundary layer between the system carrier and plastics composition. This moisture expands abruptly if the semiconductor device is heated from room temperature to temperatures of up to 260° C. within a very short time when being soldered onto a printed circuit board. The abrupt expansion of the moisture content results in cracks and/or fractures in the plastic housing of the semiconductor device, which is referred to as the "popcorn effect".

In order to prevent this popcorn effect, it is desired to prevent the accumulation of moisture in the boundary layer between the semiconductor device components and plastics composition. The accumulation of moisture can be reduced by improving the adhesion between the surfaces of the semiconductor device components and the surface of the plastics composition. Various approaches are known for improving the adhesion. U.S. Pat. No. 5,554,569 discloses a method for mechanically roughening the surface of a flat conductor leadframe. The roughened surface enables an interlocking with the plastics composition and hence a better adhesion. However, this method is difficult and cost-intensive to carry out.

The document U.S. Pat. No. 5,205,036 discloses a method by which the surface regions of electrical connection elements of semiconductor device components of a semiconductor device that are to be kept free of a protective film within a plastics composition can be kept free prior to the assembly of the components, in which case the protective film may have silicon nitrides, silicon oxides, silicon carbides and/or diamond-like carbon.

Document DE 101 24 047 discloses an electronic device with semiconductor chips and system carriers, and also methods for producing the same, a metallic system carrier having an electrodeposited adhesion layer made of metal oxides, in particular the metals zinc and chromium, with formation of a dendritic morphology. This device and the production method have the disadvantage that such a dendritic morphology can be produced by electrodeposition exclusively on metallic surfaces, so that this adhesion promoter layer cannot be produced for semiconductor device components such as system carriers made of ceramic or printed circuit board material without prior coating with a short-circuiting but metallically conductive layer.

The document DE 102 21 503 discloses a metal object which is partially provided with nanopores in a surface section and can be used as connection, carrying or conduction component for a semiconductor device. In this case, the nanopores in surface regions of the metal object improve the adhesion to a plastics composition of a semiconductor device. This known object also has the disadvantage that an improvement of the adhesion can only be effected on surfaces of metals and cannot be used for different materials of semiconductor device components of a semiconductor device.

For these and other reasons, there is a need for the present invention.

SUMMARY

The invention relates to a semiconductor device with semiconductor device components embedded in a plastics composition, and in particular to the use of organosilicon and organometallic compounds for producing an adhesion promoter layer. In one embodiment, the adhesion promoter layer on the surfaces of the semiconductor device components of a semiconductor device has a microporous morphology and has an average thickness D of between $5\ \text{nm} \leq D \leq 300\ \text{nm}$. In this case, the adhesion promoter layer has nanoscale ceramic grains applied wet-chemically.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the FIGS. being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor device with semiconductor device components, the semiconductor device components having a reliable adhesion to a plastics composition surrounding them. The reliable adhesion between the plastics composition and the different materials of the semiconductor device components made of metal, ceramic or other plastic materials is intended to be achieved prior to application or prior to embedding of the semiconductor device components in the plastics composition.

In one embodiment, the invention provides a semiconductor device with semiconductor device components embedded in a plastics composition. The surfaces of the semiconductor device components partially comprise an adhesion promoter layer with microporous morphology between the semiconductor device components and the plastics composition. The average thickness D of the adhesion promoter layer with microporous morphology is between $5\ nm \leq D \leq 300\ nm$. For this purpose, the adhesion promoter layer has nanoscale ceramic grains applied wet-chemically.

"Ceramic" is used here to include compositions having semiconductor or metal oxides, semiconductor or metal carbides, semiconductor or metal nitrides and semiconductor or metal carbonitrides. "Nanoscale" is used here to describe grains having an average size of between 0.1 nm and 100 nm.

According to one embodiment of the invention, the adhesion promoter layer is deposited on the semiconductor device components by means of a wet-chemical technique. "Wet-chemical" is used here to indicate deposition techniques which do not require a current source. Consequently, "wet-chemical" does not include electrodeposition, electrophoretic deposition and electrochemical techniques.

The adhesion promoter layer is applied on the semiconductor device components by means of a wet-chemical technique which enables the coating of electrically nonconductive and electrically conductive surfaces. The adhesion promoter layer may be deposited for example by means of a sol-gel technique or by means of a solution containing nanoparticles. A thin layer, for example consisting of a few atomic layers, may be produced after the evaporation of the solvent.

One embodiment of the invention is that the adhesion promoter layer can be arranged on all surfaces of semiconductor device components comprising a wide variety of materials, so that it forms a moisture-and corrosion-resistant boundary layer between metal surfaces, ceramic surfaces and/or other plastic surfaces of the semiconductor devices and the material of the plastics composition, which has an epoxy resin, by way of example. Consequently, unlike known adhesion promoter layers in the prior art, the adhesion promoter layer made of nanoscale ceramic grains applied wet-chemically is no longer restricted to metallic surfaces, but rather can also be applied on system carriers which constitute a ceramic plate or a printed circuit board with a correspondingly patterned metallic coating.

The adhesion promoter layer according to the invention achieves an improved adhesion between the different materials of semiconductor device components and the plastics composition, which ensures a high reliability even under extreme moisture and thermal load cycling of the semiconductor devices.

The adhesion promoter layer applied wet-chemically leads to a significant enlargement of the surface area and brings about a high microroughness. The wettability of the plastics composition is thereby significantly increased. This larger contact area simultaneously means a significant increase in the adhesion of the molding material or the plastics composition to the semiconductor device components. This leads to an improved reliability of the device.

Moreover, the use of inexpensive molding compositions is made possible by the adhesion promoter layer, since the adhesion to the semiconductor device components is improved. The adhesion promoter layer also makes it possible to use a higher proportion of mold release agents in the plastics composition, since the adhesion between the embedded semiconductor components and the plastics composition is improved. The higher proportion of mold release agents results in reduced adhesion to the mold tool and a lower failure rate.

Wet-chemical processes are also simple and can be used to simultaneously coat surfaces that are not electrically conductive and surfaces that are electrically conductive. This makes it possible to coat a ceramic substrate, a semiconductor chip and a leadframe without having to change the production method.

An optimum composite system having the totality of carrier substrate-surface-interface-plastics composition is produced with the adhesion promoter layer according to the invention on the surfaces of the semiconductor device components. The composite system is determined by the stress behavior in the interface as a result of polymerization shrinkages, plastic swellings and especially by the different coefficients of thermal expansion of ceramics, metals and plastics.

Thus, differences by more than one order of magnitude in the coefficient of thermal expansion arise between metals and plastics, and up to two orders of magnitudes between ceramics and plastics. Although the coefficient of thermal expansion of the plastics composition was able to be reduced by more than a factor of 2 by the development of filled organic polymers, this is associated with a reduction of the elasticity of the plastics composition, which in turn restricts the relief of stress in the interface between plastics composition and semiconductor device components. Irreversible material displacements and cracking can thus occur in the microscopic range of the interface as long as the chemical and micromechanical anchoring of the composite partners in the interface does not enable a redistribution of the forces.

In order to enable the redistribution of the forces, an interface must therefore have a specific thickness which distributes the acting forces over a larger volume. Therefore, it is important not just to achieve a high degree of anchoring between semiconductor device components and the embedding plastics composition, but also to ensure an optimum elasticity by means of property gradients in the polymer layer of the plastics composition. Consequently, the composite strength is not solely determined by microanchorings, but rather is achieved in summary by means of a chemically adhesive component, a microretentive component and a microelastic component. The chemical component is determined by the chemical surface structure of the carrier substrate and influenced by the reactive or adhesive groups of the adhesion promoter layer.

In this respect, according to the invention the adhesion promoter layer has a thickness of between $5\ nm \leq D \leq 300\ nm$, preferably between $1\ nm \leq D \leq 40\ nm$. The ceramic grains of the adhesion promoter layer preferably have an average size of less than 33%, preferably 20%, of the thickness of the adhesion promoter layer. The grains have an average size of between 0.1 nm and 100 nm, preferably between 0.1 nm and 50 nm, preferably between 0.1 nm and 10 nm.

The thickness of the adhesion promoter layer is therefore thick enough to reliably achieve a sufficient coverage of the surfaces, but thin enough that the effect of the inherent brittleness of a ceramic material is reduced. Consequently, the adhesion promoter layer according to the invention is to some extent flexible.

Wet-chemical deposition techniques have the further advantage that the microstructure and morphology of the adhesion promoter layer can be determined by the choice of the deposition technique, the deposition conditions and the layer thickness. In particular, it is possible to set the porosity and the roughness of the outer surface of the layer. The layer coverage and also the morphology can be optimized simultaneously by the setting of the deposition conditions. The interlocking between the plastics composition and the semiconductor device components can thus be optimized.

In one embodiment, the adhesion promoter layer includes semiconductor and/or metal oxides or semiconductor and/or metal carbides or semiconductor and/or metal nitrides or semiconductor and/or metal carbonitrides, each having one or more of the elements Al, B, Ce, Co, Cr, Ge, Hf, In, Mn, Mo, Nb, Nd, Ni, Pb, Pr, Pt, Rb, Re, Rh, Ru, S, Sb, Sc, Si, Sm, Sn, Sr, Ta, Te, Ti, Tl, Tm, U, V, W, Yb, Zr or Zn. Oxides, nitrides, carbides and carbonitrides have the advantage that they can be produced as layers in a simple manner by wet-chemical techniques.

The adhesion promoter layer that arises, the adhesion promoter layer, preferably has a semiconductor and/or metal oxide of the group $Al_2O_3$, $B_2O_3$, $Ce_2O_3$, $CoO$, $Co_2O_3$, $GeO_2$, $HfO_2$, $In_2O_3$, $Mn_2O_3$, $Mn_3O_4$, $MoO_2$, $Mo_2O_5$, $Nb_2O_3$, $NbO_2$, $Nd_2O_3$, $Ni_2O_3$, $NiO$, $PbO$, $Pr_2O_3$, $PrO_2$, $PtO$, $Pt_3O_4$, $Rb_2O$, $ReO_2$, $ReO_3$, $RhO_2$, $Rh_2O_3$, $RuO_2$, $SO_3$, $Sb_2O_4$, $Sb_4O_6$, $Sc_2O_3$, $SiO_2$, $Sm_2O_3$, $SnO$, $SnO_2$, $SrO$, $Te_2O_5$, $TeO_2$, $TeO_3$, $TiO$, $TiO_2$, $Ti_2O_3$, $Tl_2O_3$, $Tm_2O_3$, $UO_2$, $U_3O_8$, $UO_3$, $VO$, $V_2O_3$, $V_2O_4$, $V_2O_5$, $WO_2$, $WO_3$, $Yb_2O_3$, $ZrO_2$ or $ZnO$ or mixtures thereof or $SiC$ or $TiN$, or $TiCN$ or $WC$. These materials have the advantage that they can provide an intensive coupling to metallic surfaces. The oxides of the semiconductors such as $SiO_2$ and $GeO_2$ are indeed also able to form a connection having high adhesion strength with printed circuit board surfaces and ceramic surfaces. Preferred materials are $Al_2O_3$, $ZrO_2$, $SiC$, $TiN$, $TiCN$ and $WC$. These materials have the advantage that they have a low polarity.

In this embodiment, the adhesion promoter layer includes a substantially purely inorganic layer which is solid and hard. This adhesion promoter layer has a low tendency to form covalent bonds and a high surface energy that is rather hydrophilic.

In a further embodiment, the adhesion promoter layer includes organically modified nanocomposites which can be produced by means of a sol-gel technique: the surface of the nanoparticles is modified, while the nanoparticles are formed from a solution or a sol by a condensation reaction. The nanoparticles are formed with a solid core and an organic or organic-inorganic inorganic shell of a polymer structure. The shell polymers may be selected such that the surfaces of the nanoparticles and the applied layer have desired properties. This embodiments of the adhesion promoter layer may have a low surface energy and be hydrophobic and oleophobic.

The application of organically or inorganically modified nanoparticles on the semiconductor device components may lead to a reduction of the sintering temperature. The risk of undesired reactions between the adhesion promoter layer and the semiconductor components can thus be reduced.

In a further embodiment, the adhesion promoter layer includes two layers. The first layer includes nanoscale ceramic grains and the second layer includes perfluoroalkyl-modified polysiloxane. The second layer covers the first layer. In this hybrid structure, the hybrid matrix is hard and chemically resistant, while the covering layer has the properties of the modified nanocomposites.

In a further embodiment of the invention, the porosity of the adhesion promoter layer increases gradually from a pore-free coating on the surfaces of the semiconductor device components to a microporous morphology in the transition region to the plastics composition. As a result of the gradual increase in porosity from an initially closed adhesion promoter layer to a microporous morphology of the surface, the surface of the semiconductor device components is protected against interfacial corrosion in the metal-plastic composite, while the interlocking with the plastics composition is intensified by the gradual increase in porosity with the thickness of the adhesion promoter layer. In this case, the material of the adhesion promoter layer forms complex bonds with the polymeric plastics composition. This inner structure of the adhesion promoter layer likewise relieves stresses in the interfaces.

The average layer thickness D deposited wet-chemically in this case lies between $5\ nm \leq D \leq 300\ nm$; preferably, the average layer thickness D lies between $5\ nm \leq D \leq 40\ nm$. These layer thickness ranges have the advantage that the layer can be deposited in one deposition process, so that the coating method can be carried out rapidly and cost-effectively. The use of this thickness range also avoids the risk of cracking within the layer and also delamination of the layer from the semiconductor device components.

The adhesion promoter layer on the surfaces of the semiconductor device components preferably has a thickness-dependent morphology, as mentioned above. The roughness of the interface between the plastics composition and the adhesion promoter layer enables an improved mechanical interlocking between the different materials. The stress in the interface that is caused by the different expansion coefficients is better compensated for. The reliability of the device is thereby increased.

In one embodiment, the system carrier has a chip island. At least the top side of the chip island is coated with the adhesion promoter layer. The semiconductor chip is fixed on the top side of the chip island by means of an adhesion layer made of a die attach material. The adhesion promoter layer improves the adhesion between the die attach material and the chip island. The rear side of the chip island may also have an adhesion promoter layer. This is the case for example if the system carrier has a leadframe which is intended to be completely embedded in the plastics composition. An improved interlocking between the chip island and the die attach material and also between the chip island and the plastics composition is thus provided.

In a further embodiment of the invention, the semiconductor device includes, as semiconductor device component, a wiring substrate with a patterned metal coating. With the technologies known to date, wiring substrates of this type can be coated with the customary adhesion promoter layers only in the region of the patterned metal coating, while the insulating surface regions cannot be coated galvanically by the conventional methods, unless the risk is taken of a thin, short-circuiting metallic coating of the entire wiring substrate. However, that is at odds with the purpose and the task of a wiring substrate of this type, which is intended to produce connection lines and interconnects between different elements of the semiconductor device with the aid of the patterned metal coating. In the case of the adhesion promoter layer according to the invention, both the region of the wiring substrate which is nonconductive and the region of the substrate with a patterned metal coating can be completely and uniformly provided with an adhesion promoter layer.

In a further embodiment of the invention, the semiconductor device includes, as semiconductor device component, a ceramic substrate with patterned metal layers. Multilayer ceramic substrates of this type are used for constructing semiconductor devices in radiofrequency technology. In this case, too, it is possible, by means of the adhesion promoter layer according to the invention, for the ceramic surfaces of the semiconductor device component now also to be completely provided with an adhesion promoter layer.

It is furthermore provided that the semiconductor device has, as semiconductor device component, a printed circuit board with a patterned metal coating. In this case, too, regions of the insulating board can be coated with the adhesion promoter layer according to the invention in the same way as the patterned metal coating on the printed circuit board, so that an intensive connection to the plastics composition covering the printed circuit board becomes possible.

The most frequent application of the adhesion promoter layer is envisaged for semiconductor devices which have as semiconductor device components, inner flat conductors which, outside the plastics composition merge into external flat conductors as external contacts. Internal flat conductors of this type have a solid metal body, the surfaces of which can now form an intensive connection to the surrounding plastics composition with the aid of the adhesion promoter layer according to the invention. It is furthermore possible also to provide surfaces of semiconductor chips within the semiconductor devices with the adhesion promoter layer and also to envelope inner flip-chip contacts and/or bonding connection wires as connection elements completely in an adhesion promoting layer.

A further embodiment of the invention relates to a system carrier having a plurality of semiconductor device positions arranged one after another and/or one behind another in rows and/or columns. System carriers of this type serve for receiving semiconductor device components onto a spatial wiring structure with chip pads for semiconductor chips and contact pads for electrical connections to electrodes of a semiconductor chip. The surfaces of the system carrier according to the invention have an adhesion promoter layer which is selectively applied wet-chemically and has nanoscale ceramic grains. The adhesion promoter layer has a microporous morphology. The adhesion promoter layer, for its part, has a thickness D of between 5 nm≦D≦300 nm. In this case, the chip pads and the contact pads of the system carrier remain free of the adhesion promoter layer.

The adhesion promoter layer per se corresponds in terms of its composition and in terms of its morphology to the adhesion promoter layer as has already been described in detail above for application on semiconductor device components. The system carrier may accordingly have a ceramic substrate or a wiring substrate with a patterned metal coating or a printed circuit board with a patterned coating. In all cases, the system carrier can be selectively coated with an adhesion promoter layer according to the invention on the surfaces which come into contact with plastics composition during the production of the semiconductor devices.

In particular, this is the case if the system carrier has internal flat conductors with contact pads and chip pads. The contact pads and/or chip pads merge into external flat conductors and are held by a flat conductor leadframe of the system carrier. In this case, the flat conductor leadframe may have a flat conductor strip with a multiplicity of semiconductor device positions arranged one behind another.

The internal flat conductors have on their surfaces the adhesion promoter layer, the composition and structure of which have already been described in detail above. However, the contact pads, the chip pads, the external flat conductors and the flat conductor leadframe remain free of the adhesion promoter layer. A system carrier of this type is a preliminary product for the production of semiconductor devices and can be produced as a preliminary product by supplier companies in the semiconductor industry. The possibility of the surfaces of contact pads, chip pads, external flat conductors and flat conductor leadframe remaining free may be achieved by various methods such as are described e.g. in the abovementioned document U.S. Pat. No. 5,205,036. Alternative methods are discussed below.

In a further embodiment of the system carrier with a selectively arranged adhesion promoter layer, the system carrier includes a perforation along a system carrier leadframe for its positioning in a placement machine. This has the advantage that a multiplicity of semiconductor devices can be produced in an automated manner on such a strip-type system carrier.

Furthermore, the system carrier may preferably include a metal alloy plating made of silver and/or a solder alloy on the contact pads and the chip pads. In this case, the contact pads and/or the chip pads not only remain free of adhesion promoter layer but are themselves covered with a coating that promotes a soldering or bonding process.

In a further embodiment of the invention, the system carrier itself has ultrapure copper and/or a copper alloy, which are advantageous due to their high electrical conductivity.

A method for producing a system carrier for semiconductor devices has the following processes. Firstly, a substrate plate having at least one metal surface is patterned to form a system carrier. A plurality of successive patterns for receiving semiconductor device components in semiconductor device positions are produced during the patterning. The surfaces of the system carrier which form an interface with a plastics composition during the manufacture of semiconductor devices are subsequently coated with an adhesion promoter layer. The adhesion promoter layer is applied by means of a wet-chemical technique.

The adhesion promoter layer is preferably produced by at least two processes. In a first process, a liquid is applied on the surfaces of the semiconductor device component.

The liquid may have one or more of the elements forming the adhesion promoter layer in different forms. The elements may be present as solid nanoparticles colloidally in a solution. As an alternative, the elements may be provided as dissolved metal or semiconductor organic complexes in a solution.

The liquid may be applied on the semiconductor device components by means of various techniques. Possible techniques are dipping, pouring, spraying, printing and rolling. Dipping is suitable if the top side and rear side of a system carrier are intended to be coated and is advantageously used for the coating of leadframes. Spraying is suitable if only one surface is intended to be coated and is advantageously used for the coating of the top side of ceramic or dielectric substrates.

After the liquid is applied on the surfaces, in a further process, the solution is evaporated or decomposed and a layer is formed.

The thickness of the adhesion promoter layer may be determined by the thickness of the applied layer and by the concentration of the nanoparticles or of the dissolved complexes in the initial liquid. A thicker layer can be reduced for example by a plurality of deposition and evaporation process.

A microporous morphology of the adhesion promoter layer which has nanoscale ceramic grains arises during coating. The adhesion promoter layer is applied with an average thickness D of between 5 nm≦D≦300 nm, preferably between 5 nm≦D≦40 nm. In the case of this coating, a closed layer a few nanometers thick deposits on the surfaces of the system carrier, which layer may simultaneously protect the surfaces against erosion and corrosion. As the coating becomes thicker, the pore density increases, so that a microporous morphology occurs which may form a high affinity with the plastics composition and a high adhesion to the plastics composition.

In a first form of implementation, a mixture having a solvent and colloidal nanoparticles is applied on the surfaces of the system carrier. The solvent is evaporated in order to produce a layer on the surfaces of the system carrier. The layer is often called a green layer and may be thicker than the adhesion promoter layer to be formed. This initial form of the nanoparticles has the advantage that prefabricated nanoparticles having the desired composition can be used. The solvent can be evaporated at low temperatures, so that it is possible to avoid undesired secondary reactions between the layer and the semiconductor device components.

In an alternative form of implementation, the coating is effected by means of a sol-gel method. The nanoparticles may be provided as solid nanoparticles in the sol or the elements that form the nanoparticles may be contained as dissolved complexes in the sol. The sol-gel technique has the advantage that the surface of the nanoparticles can be modified by the further component of the sol, so that the properties of the applied layer can be set. In this way it is possible to reduce the sintering temperature, by way of example.

After the application of the adhesion promoter layer on the surfaces of the system carrier, a sintering process or alloying process or a firing process or a corona treatment is preferably carried out. Residual solvent is thereby removed, the applied layer is densified and fixed more solidly on the surface. The morphology of the layer may also grow in this process and may also be determined at least in part by the method conditions. In particular, it is possible for the porosity and grain size to be set and optimized by the conditions in order to increase the microroughness of the layer surface. In a further preferred implementation of the method, surface regions to be kept free are covered with a protective layer prior to the coating of the system carrier with adhesion promoter. After coating, the protective layer may advantageously be caused to swell, so that it can be removed with the overlying adhesion promoter layer on the surface regions that are to be kept free.

In a further implementation of the method, the surface regions that are to be kept free are uncovered again only after the surfaces of the system carrier have been coated with adhesion promoter. In this method, the surface regions on which the adhesion promoter is intended to remain may be protected prior to the uncovering process. The uncovering process may be effected by means of laser removal or by means of plasma etching methods.

A method for producing a plurality of semiconductor devices using a system carrier having a plurality of semiconductor device positions additionally has the following processes. Firstly, provision is made of a system carrier with a selectively applied adhesion promoter layer on its surfaces. The selectivity relates to the fact that only the surface regions of the system carrier which are intended to form a boundary layer with a plastics composition are covered with an adhesion promoter layer. By contrast, contact pads for electrical connections and/or chip pads for making contact with a semiconductor chip are kept free of the adhesion promoter layer.

The semiconductor device components, such as semiconductor chips, are then applied to a system carrier of this type in the semiconductor device positions with the semiconductor chips being connected to contact pads of the system carrier via electrical connection elements. After all of the semiconductor device components have been applied on the system carrier, the semiconductor device components are embedded in a plastics composition. Finally, the system carrier can then be separated into individual semiconductor devices.

In this method, the system carrier itself may be a printed circuit board with a metal structure or a multilayer ceramic plate or a metallic flat conductor leadframe. The advantage of this method is that the application of the adhesion promoter layer is independent of the material of the semiconductor device components. Thus, metallic flip-chip contacts as well as metallic bonding wires may be provided with an adhesion promoter layer wet-chemically in the same way as the surfaces of the semiconductor chip and the surfaces of the system carrier. This property of the adhesion promoter layer and a wet-chemical method are employed in particular when prior to embedding of the semiconductor device components in a plastics composition, the surfaces of semiconductor device components that have not yet been coated are likewise coated with the adhesion promotor.

In an alternative method for producing semiconductor devices using a system carrier, it is also possible to use a system carrier which initially has no adhesion promoter layer whatsoever. Semiconductor device components, such as semiconductor chips, are applied to the system carrier in a first process in semiconductor device positions with the semiconductor chips being connected to contact pads of the system carrier for electrical connections. Only afterward is an adhesion promoter layer applied to all the surfaces of the semiconductor device components which are intended to be embedded in a plastics composition. For this purpose, the adhesion promoter layer has the abovementioned properties with regard to the average thickness D and porosity. The semiconductor device components now provided with an adhesion promoter layer are subsequently embedded in a plastics composition.

Finally, the system carrier may be separated into individual semiconductor devices. In this method, it is incumbent upon the semiconductor manufacturer firstly to mount all the semiconductor device components on a conventional carrier substrate and then for the manufacturer to apply the adhesion promoter layer to the surfaces of the semiconductor device components. One advantage of this alternative method is that none of the surfaces to be covered with a plastics composition is free of an adhesion promoter layer.

Figure 1:
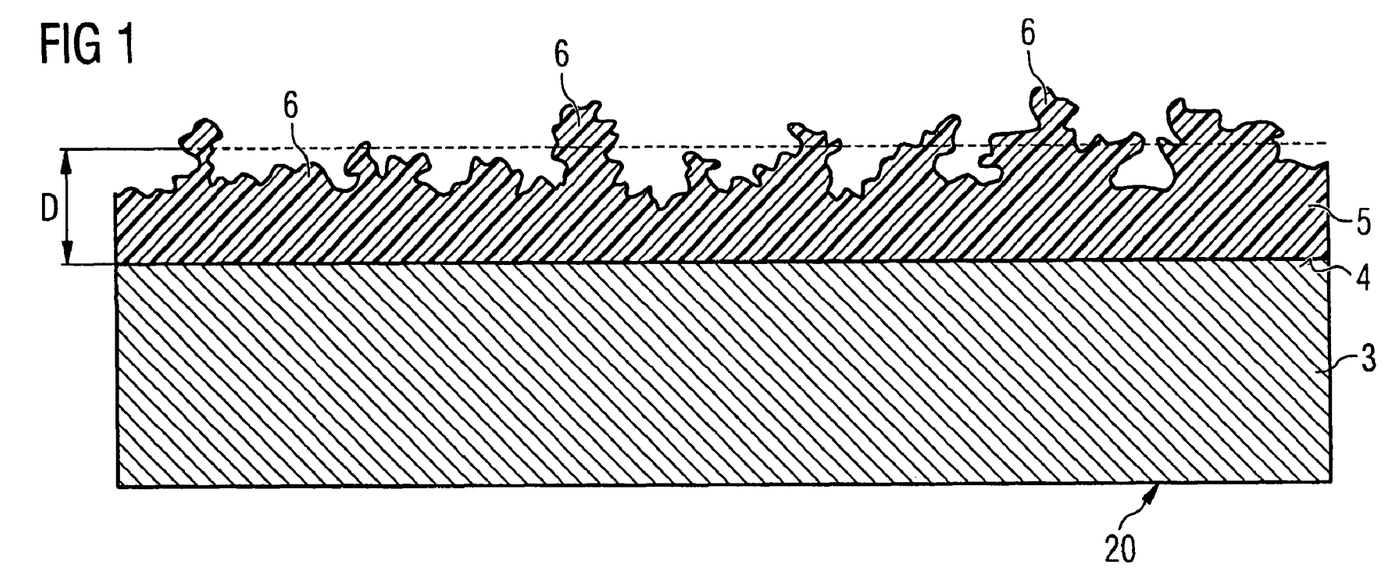
FIG. 1 is a schematic illustration of an adhesion promoter layer on a metallic system carrier of a semiconductor device.

FIG. 1 is a schematic illustration of an adhesion promoter layer 5 on a metallic system carrier 20 of a semiconductor device. The adhesion promoter layer 5 has an average thickness D which lies between 5 and 300 nm and, in the illustrated embodiment of the invention, has a preferred thickness ranging between 5 and 40 nm. The lower 5 to 10 nm of the adhesion promoter layer 5 cover the surface 4 of this metallic semiconductor device component 3 in a completely closed morphology, so that the surface 4 is protected against interfacial corrosion and erosion.

Above this region between 5 and 10 nm, the porosity of the adhesion promoter layer 5 increases and has a microporous morphology 6 in the topmost region. The microporous morphology 6 of the adhesion promoter layer 5 supports the interlocking with a plastics composition that is to be applied to the surface 4. Moreover, the microporous morphology 6 of the adhesion promoter layer 5 fosters the formation of chemical bridges between the plastics composition and the adhesion promoter layer 5. In this case, the adhesion promoter layer 5 forms a type of gel structure which superficially penetrates the plastics composition and thus forms an elastic transition layer between the system carrier 20 and the plastics composition (not shown). The transition layer between the microporous morphology 6 of the adhesion promoter layer 5 and the plastics composition provides for compensation of the coefficients of thermal expansion between the metallic system carrier material and the polymeric plastic of the plastics composition. The detail from a system carrier 20 as illustrated in FIG. 1 represents a surface region of a chip island 3.

The adhesion promoter layer 5 has zirconium oxide and was produced by means of a mixture in which nanoparticles made of zirconium oxide had been colloidally dissolved. This mixture was applied on the leadframe 3 by immersion. The solvent was evaporated and the layer was sintered in order to form the adhesion promoter layer 5 with nanoscale grains.

Figure 2:
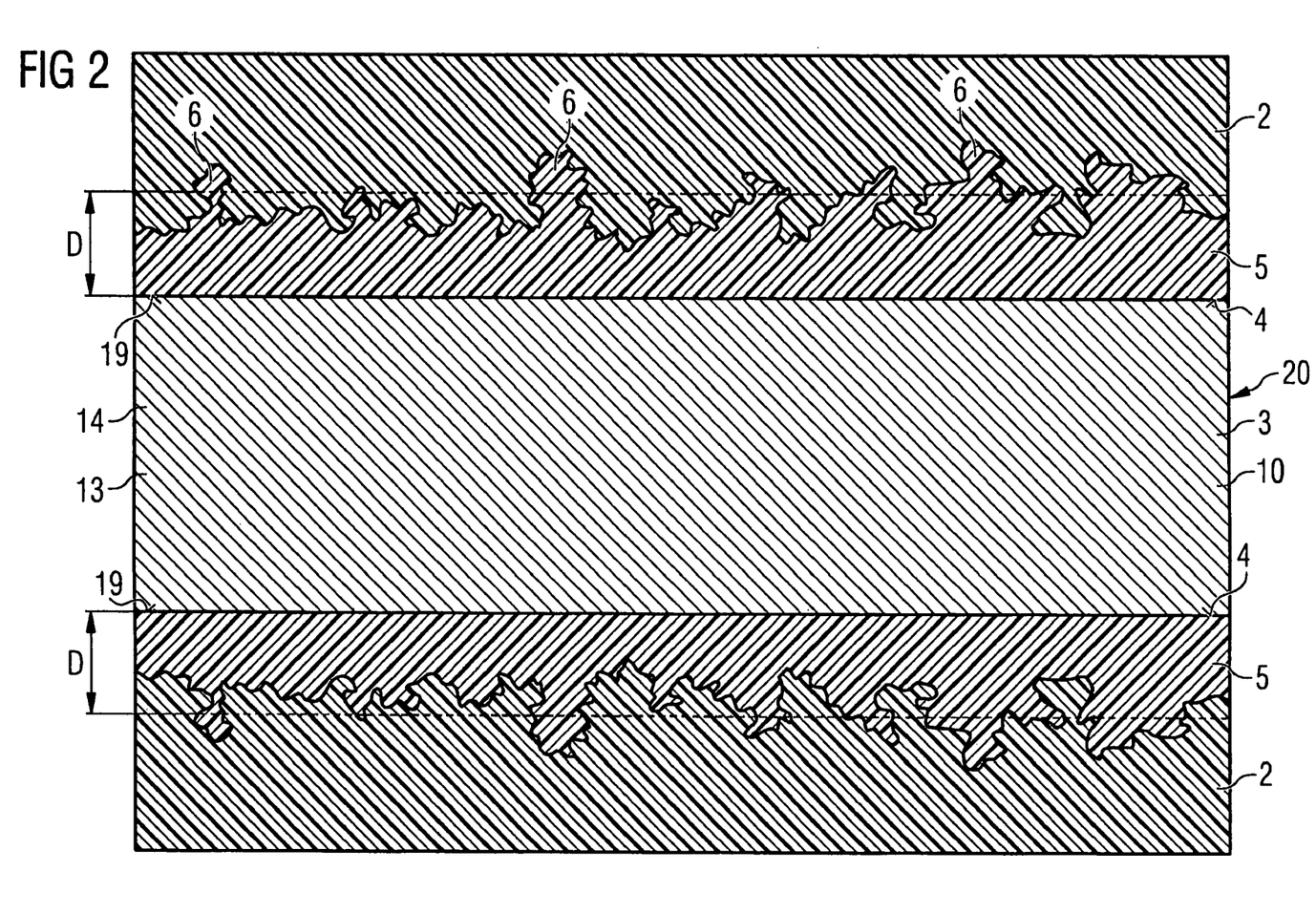
FIG. 2 illustrates a schematic cross section through an internal flat conductor which is embedded in a plastics composition and is coated on both sides.

FIG. 2 illustrates a schematic cross section through an internal flat conductor 10 which is embedded in a plastics composition 2 and is coated on both sides. This schematic cross section does not illustrate the true thickness relationships between the average thickness D of the adhesion promoter layer 5 and the thickness extent of the internal flat conductor 10. Internal flat conductors 10 of this type may have a thickness of the order of magnitude of millimeters, while the average thickness D of the adhesion promoting layer 5 is in the region of a few 5 nanometers. If, instead of the internal flat conductor 10, a bonding wire 14 is surrounded by an adhesion promoter layer 5, then the thickness differences are considerable in this case, too, since bonding wires 14 as connection elements 13 have a diameter of more than 10 μm.

Figure 3:
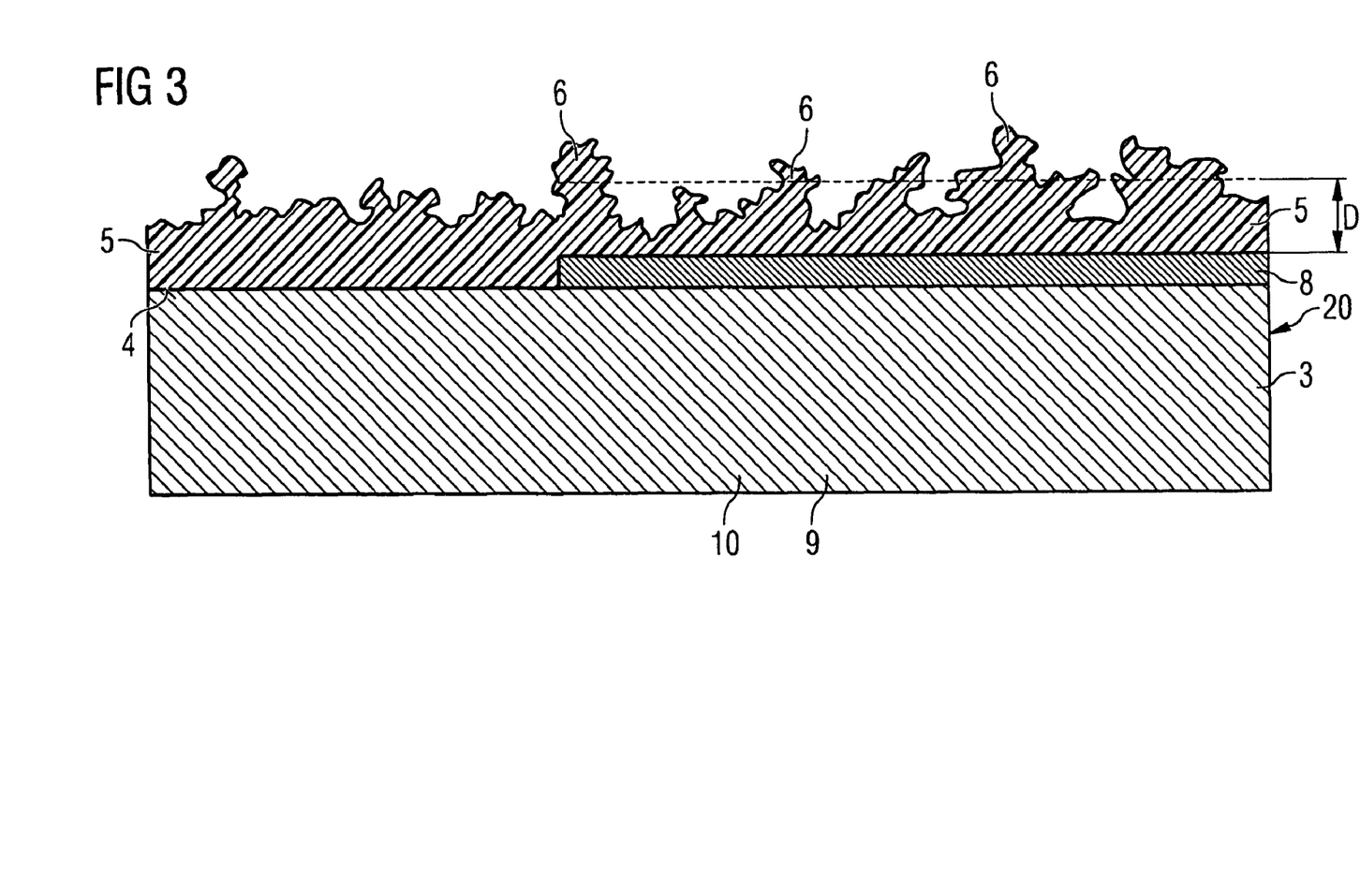
FIG. 3 illustrates a schematic cross section through a wiring substrate having an insulating printed circuit board with a patterned metal coating and an adhesion promoter layer.
Figure 4:
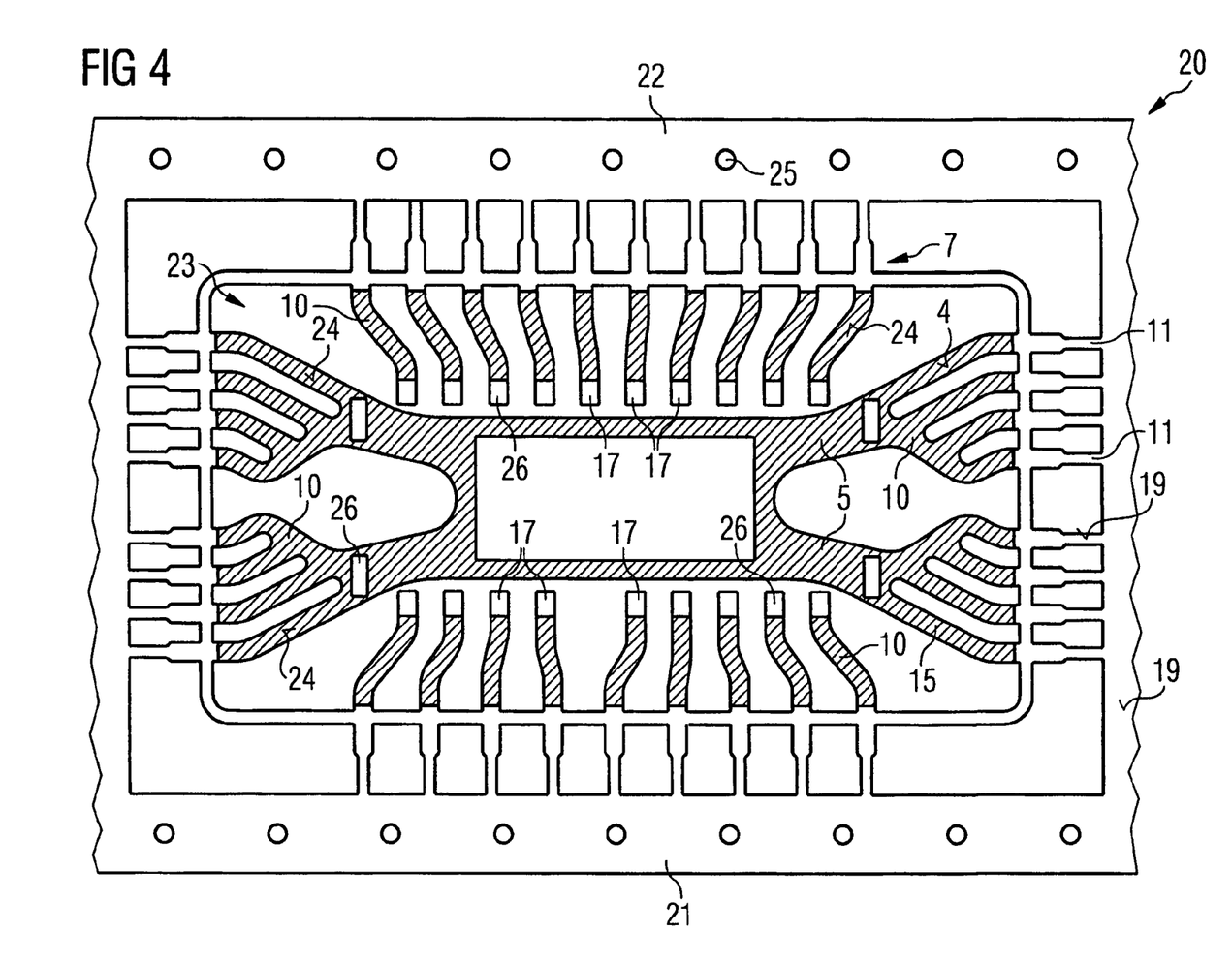
FIG. 4 illustrates a schematic plan view of a metallic system carrier, the surface of which is partially provided with an adhesion promoter layer.

The surface 4, which is illustrated here as a straight line and interface, is also not smooth and straight, as illustrated by the investigations and results of the diagrams of FIGS. 3 and 4, rather here as well a transition of a few nanometers is formed in which the composition of the adhesion promoter layer 5 merges into the composition of the internal flat conductor 10. The cause of a gradual transition between adhesion promoter layer and metal material resides at least partially in the activation effect of the coating process by which the adhesion promoter layer 5 is applied to the material of the semiconductor device component 3. The morphology is also set by the sintering process, since the increased sintering temperature effects the nucleation and the grain growth of the applied layer.

FIG. 3 illustrates a schematic cross section through a wiring substrate 7 having a printed circuit board 9 with a patterned metal coating 8 and an adhesion promoter layer 5. Instead of the printed circuit board 9 made of an epoxy resin, a ceramic plate may also form the system carrier 20. The interface between adhesion promoter layer 5 and system carrier 20 thus has different interface materials and illustrates that the wet-chemical deposition according to the invention leads to an adhesion promoter layer 5 with a microporous morphology in principle on all materials. Consequently, the adhesion promoter layer 5 can be used not only for metallic system carriers 20, such as flat conductor leadframes, but can also be used to improve adhesion of the surfaces of a panel and the plastics composition arranged over the latter. The microporous morphology may have not only spherical geometries but also dendritic or spongy structures.

FIG. 4 illustrates a schematic plan view of a metallic system carrier 20, the surfaces 19 of which are partially provided with an adhesion promoter layer 5. This system carrier 20 is based on a flat conductor leadframe 21 having a plurality of semiconductor device positions 23 on a flat conductor strip 22. In order to ensure that, in the course of placement on the flat conductor strip 22, the semiconductor chips can be positioned on the chip pad 16 provided therefor, the flat conductor leadframe 21 has a perforation 25. The surfaces 24 of the internal flat conductors 10, apart from contact pads 17, are covered with the adhesion promoter layer 5 according to the invention, which is illustrated by the hatching of the corresponding areas.

The contact pads 17, which are kept free of the adhesion promoter layer 5, are provided for fitting connection elements in the form of bonding wires. The internal flat conductors 10 provided with an adhesion promoter layer 5 merge into external flat conductors 11 having no adhesion promoter layer. Consequently, within the flat conductor leadframe 21, a spatial wiring structure 15 is produced which has flat conductors 10, 11 which will partially come into contact with a plastics composition and partially remain free of the plastics composition. The contact pads 17, which remain free, may be provided with a corresponding metal plating 26, made of a silver solder for example, in order to improve the bonding properties.

Figure 5:
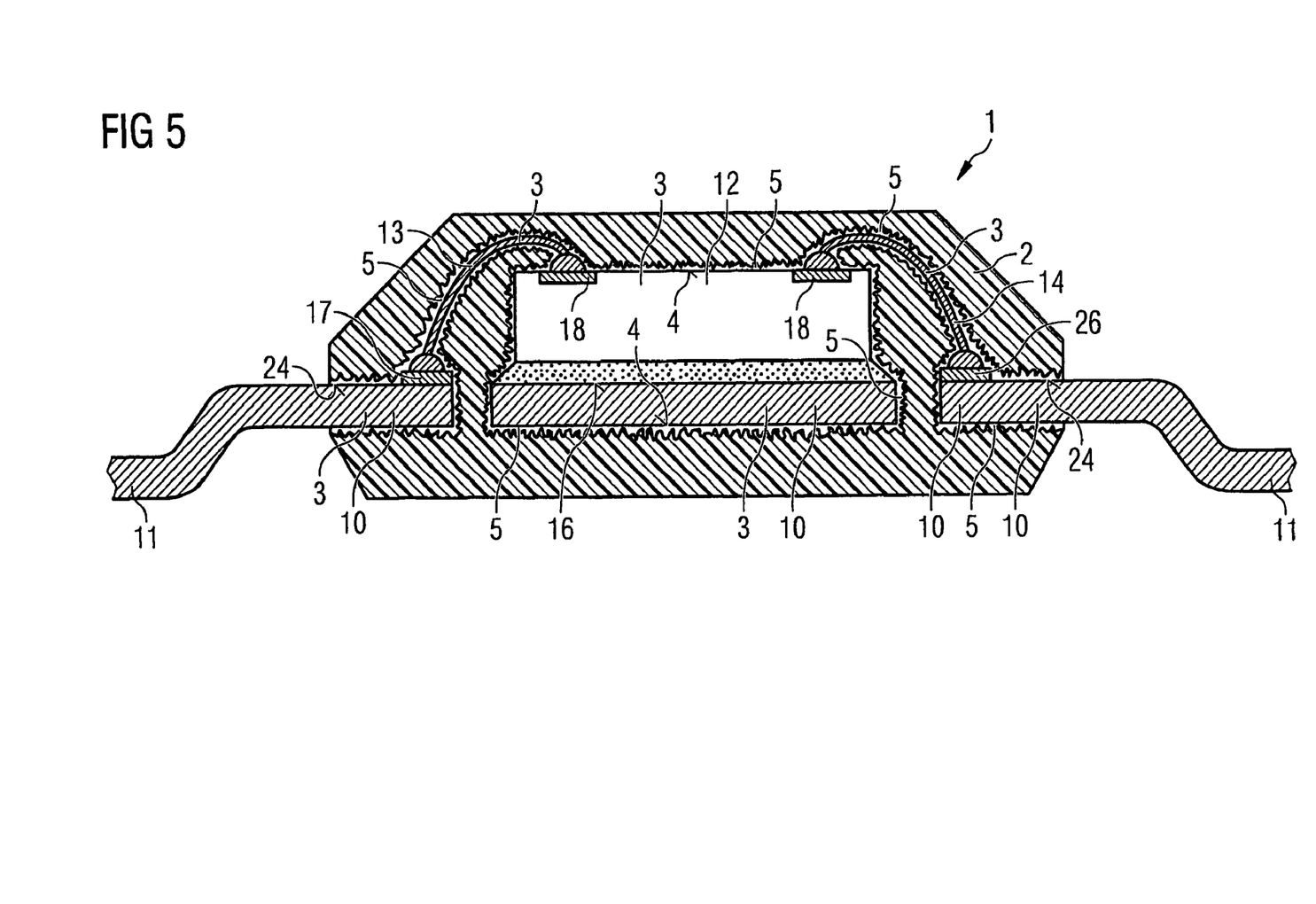
FIG. 5 illustrates a schematic cross section through a semiconductor device with semiconductor device components whose surfaces have an adhesion promoter layer.

FIG. 5 illustrates a schematic cross section through a semiconductor device 1 with semiconductor device components 3, the surfaces 4 of which have an adhesion promoter layer 5. In the case of this semiconductor device, in order to improve the surface adhesion between the surfaces of the semiconductor device components 3 and the plastics composition 2, all of the semiconductor device components 3 have been provided with an adhesion promoter layer 5 applied wet-chemically after their assembly on a system carrier 20. This coating is possible not only on metallic surfaces 24 of the inner flat conductors 10 or the connection elements 13 in the form of bonding wires 14, but also on the surfaces of the semiconductor chip 12 and the electrodes 18 thereof. Consequently, the semiconductor device 1 according to the invention differs from semiconductor devices in the prior art by virtue of the fact that nonmetallic surfaces 4 are also completely covered by the adhesion promoter layer 5.

The adhesion promoter layer 5 is formed from applied nanoparticles which were sintered after their deposition to form a densified layer. Consequently, the adhesion promoter layer 5 has nanoscale grains made of zirconium oxide and has the morphology which is typical of this deposition technique.

On all surfaces 4, 19, 24 which are exposed to this process in an unprotected manner, it is possible to achieve a significant improvement in the molding composition adhesion of the plastics composition 2. The substrate carrier may also be subjected to coating with nanoparticles applied wet-chemically prior to the assembly of the semiconductor device components 3, but care must then be taken to ensure that both the contact pads 17 and the chip pads 16 of the system carrier remain free of the coating. The advantage of this process is that it involves a coating process that is easy to handle and can be applied on all sides to the surfaces 4 of the semiconductor devices which are to be anchored.

Figure 6:
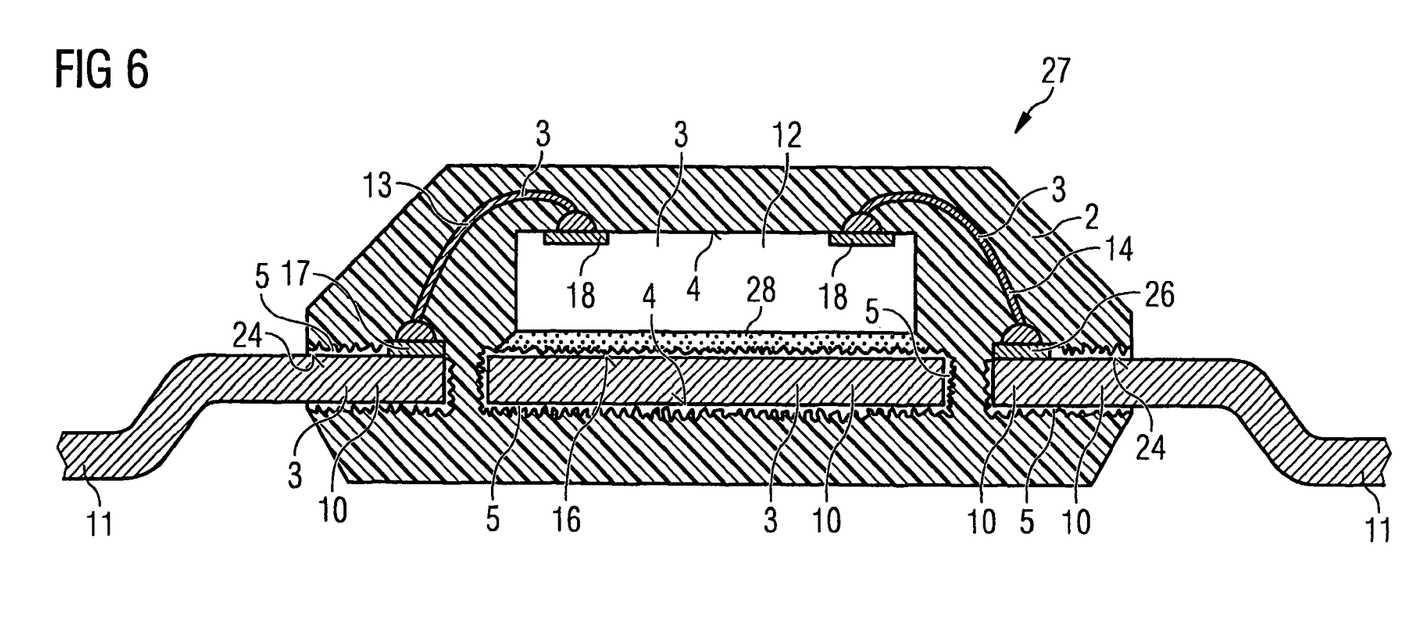
FIG. 6 illustrates a schematic cross section through a semiconductor device in which the surfaces of the flat conductor leadframe have an adhesion promoter layer.

FIG. 6 illustrates a schematic cross section through a semiconductor device 27 according to a second exemplary embodiment of the invention. In this exemplary embodiment, the surfaces of the flat conductor leadframe 20 which are arranged within the plastics composition 2 have an adhesion promoter layer 5.

The adhesion promoter layer 5 was applied on the internal flat conductor 10 and also the chip island 3 of the flat conductor leadframe 20. The adhesion promoter layer 5 was applied by means of a wet-chemical technique of dipping on the top side and rear side of the flat conductor leadframe 20 and has nanoscale ceramic grains made of $ZrO_2$ after a sintering process.

After the application of the adhesion promoter layer 5, the semiconductor chip 12 was fixed on the chip island 3 of the flat conductor leadframe 20 by means of an adhesive layer 28. Bonding wires 13 were then produced between the electrodes of the semiconductor chip 12 and the contact areas 26 of the internal flat conductors 10 in order to electrically connect the semiconductor chip 12 to the internal flat conductor 10. The semiconductor chip 12, bonding wires 13 and internal flat conductors 10 were embedded in a plastics composition 2.

The adhesion promoter layer 5 improves the adhesion between the top side 16, the chip island 3 and the adhesive layer 28 and also between the flat conductor leadframe 20 and the plastics composition 2. In contrast to the exemplary embodiment of FIG. 5, the bonding wires 13 and the semiconductor chip 12 are not coated with the adhesion promoter layer 5.

This semiconductor device 27 has the advantage that the circuit carrier 20 or flat conductor leadframe is coated with the adhesion promoter layer 5. The coated circuit carrier 20 can be used in the known production method to construct the semiconductor device 27. An improved interlocking between the metallic flat conductor leadframe 20 and the plastics composition 2 and also the adhesive layer 28 is provided without the production method having to be considerably modified.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
semiconductor device components embedded in a plastics composition, a surface of one or more of the semiconductor device components comprising an adhesion promoter layer at least partially between the semiconductor device components and the plastics composition and having an average thickness D of between $5\,nm \leq D \leq 40$ nm, the adhesion promoter layer including nanoscale ceramic grains applied wet-chemically having an average size of between 0.1 nm and 10 nm, wherein a portion of the adhesion promoter layer in contact with the semiconductor device components has a closed morphology, and a portion of the adhesion promoter layer in contact with the plastics composition has a microporous morphology formed by the nanoscale ceramic grains which interlocks with the plastics composition.

2. The semiconductor device as claimed in claim 1, wherein the adhesion promoter layer comprises semiconductor and/or metal oxides or semiconductor and/or metal carbides or semiconductor and/or metal nitrides or semiconductor and/or metal carbonitrides of one or more of the elements from a group consisting of Al, B, Ce, Co, Cr, Ge, Hf, In, Mn, Mo, Nb, Nd, Ni, Pb, Pr, Pt, Rb, Re, Rh, Ru, S, Sb, Sc, Si, Sm, Sn, Sr, Ta, Te, Ti, TI, Tm, U, V, W, Yb, Zr or Zn.

3. The semiconductor device as claimed in claim 1, wherein the adhesion promoter layer comprises a semiconductor and/or metal oxide of a group consisting of $Al_2O_3$, $B_2O_3$, $Ce_2O_3$, $CoO$, $Co_2O_3$, $GeO_2$, $HfO_2$, $In_2O_3$, $Mn_2O_3$, $Mn_3O_4$, $MoO_2$, $Mo_2O_5$, $Nb_2O_3$, $NbO_2$, $Nd_2O_3$, $Ni_2O_3$, $NiO$, $PbO$, $Pr_2O_3$, $PrO_2$, $PtO$, $Pt_3O_4$, $Rb_2O$, $ReO_2$, $ReO_3$, $RhO_2$, $Rh_2O_3$, $RuO_2$, $SO_3$, $Sb_2O_4$, $Sb_4O_6$, $Sc_2O_3$, $SiO_2$, $Sm_2O_3$, $SnO$, $SnO_2$, $SrO$, $Te_2O_5$, $TeO_2$, $TeO_3$, $TiO$, $TiO_2$, $Ti_2O_3$, $Tl_2O_3$, $Tm_2O_3$, $UO_2$, $U_3O_8$, $UO_3$, $VO$, $V_2O_3$, $V_2O_4$, $V_2O_5$, $WO_2$, $WO_3$, $Yb_2O_3$, $ZrO_2$ or $ZnO$ or mixtures thereof or SiC or TiN, or TiCN or WC.

4. The semiconductor device as claimed in claim 1, wherein the adhesion promoter layer comprises organically modified nanocomposites.

5. The semiconductor device as claimed claim 1, wherein the adhesion promoter layer comprises two layers, the first layer comprising of nanoscale ceramic grains and the second layer comprising of perfluoroalkyl-modified polysiloxane, and the second layer covering the first layer.

6. The semiconductor device as claimed in claim 1, wherein the porosity of the adhesion promoter layer increases gradually from a pore-free coating on the surfaces of the semiconductor device components to a microporous morphology in a transition region to the plastics composition.

7. The semiconductor device as claimed in claim 1, including a system carrier on which the semiconductor device components are mounted, wherein the system carrier comprises a chip island, and at least the top side of the chip island is coated with the adhesion promoter layer.

8. The semiconductor device as claimed in claim 1, wherein the semiconductor device comprises, as semiconductor device component, a wiring substrate with a patterned metal coating.

9. The semiconductor device as claimed in claim 1, wherein the semiconductor device comprises, as semiconductor device component, a ceramic substrate with patterned metal layers.

10. The semiconductor device as claimed in claim 1, wherein the semiconductor device comprises, as semiconductor device component, a printed circuit board with a patterned metal coating.

11. The semiconductor device as claimed in claim 1, wherein the semiconductor device comprises, as semiconductor device component, inner flat conductors which, outside the plastics composition merge into external flat conductors as external contacts.

12. The semiconductor device as claimed in claim 1, wherein the semiconductor device comprises a semiconductor chip as semiconductor device component.

13. The semiconductor device as claimed in claim 1, wherein the semiconductor device comprises, as semiconductor device component, inner flip-chip contacts and/or bonding connection wires as connection elements.

14. The semiconductor device of claim 1, wherein the semiconductor device components are made metal, ceramic, or plastic materials.

15. A semiconductor device comprising:
semiconductor device components embedded in a plastics composition, a surface of one or more of the semiconductor device components comprising means for promoting adhesion with microporous morphology at least partially between the semiconductor device components and the plastics composition with an average thickness D of between $5\,nm \leq D \leq 40$ nm, and the means for promoting adhesion having nanoscale ceramic grains applied wet-chemically and having an average size of between 0.1 nm and 10 nm, wherein the means for promoting adhesion has a portion contacting the plastics composition with a microporous morphology formed by the nanoscale ceramic grains which interlocks with the plastic composition.

16. A semiconductor device comprising:
semiconductor device components embedded in a plastics composition; and
an adhesion promoter layer including nanoscale ceramic grains disposed on a surface of one or more of the semiconductor device components at least partially between the semiconductor device components and the plastics composition, wherein a portion of the adhesion promoter layer in contact with the semiconductor device components has a closed morphology, and a portion of the adhesion promoter layer in contact with the plastics composition has a microporous morphology formed by the nanoscale ceramic grains which interlocks with the plastic material.

* * * * *

UNITED STATES PATENT AND TRADEMARK OFFICE
CERTIFICATE OF CORRECTION

PATENT NO. : 7,800,241 B2  Page 1 of 1
APPLICATION NO. : 11/455949
DATED : September 21, 2010
INVENTOR(S) : Bauer et al.

It is certified that error appears in the above-identified patent and that said Letters Patent is hereby corrected as shown below:

Front page, ABSTRACT, line 8 delete "5 nm$\leqq$D$\leqq$300 nm" and insert in place thereof --5 nm$\leq$D$\leq$300 nm--.

Column 13, line 45, delete "5 nm$\leqq$D$\leqq$300 nm" and insert in place thereof --5 nm$\leq$D$\leq$40 nm--.

Column 14, line 60, delete "5 nm$\leqq$D$\leqq$40 nm" and insert in place thereof --5 nm$\leq$D$\leq$40 nm--.

Signed and Sealed this
Fourth Day of January, 2011

David J. Kappos
*Director of the United States Patent and Trademark Office*